United States Patent [19]
Reich et al.

[11] Patent Number: 5,712,498
[45] Date of Patent: Jan. 27, 1998

[54] CHARGE MODULATION DEVICE

[75] Inventors: Robert K. Reich, Chelmsford; Eugene D. Savoye, Concord; Bernard B. Kosicki, Acton, all of Mass.

[73] Assignee: Massachusetts Institute of Technology, Cambridge, Mass.

[21] Appl. No.: 703,070

[22] Filed: Aug. 26, 1996

[51] Int. Cl.$^6$ .......................... H01L 29/80; H01L 31/112
[52] U.S. Cl. .......................... 257/256; 257/258; 257/262
[58] Field of Search ........................ 257/222, 223, 257/225, 226, 228, 229, 256, 257, 258, 262

[56] References Cited

U.S. PATENT DOCUMENTS

| | | | |
|---|---|---|---|
| 4,589,027 | 5/1986 | Nakamura et al. | 358/213 |
| 4,635,083 | 1/1987 | Cooper, Jr. | 257/222 |
| 4,677,589 | 6/1987 | Haskell et al. | 365/149 |
| 4,984,045 | 1/1991 | Matsunaga | 257/222 |
| 5,055,890 | 10/1991 | Dawson et al. | 257/192 |
| 5,276,521 | 1/1994 | Mori | 358/213.31 |
| 5,317,174 | 5/1994 | Hynecek | 437/50 |
| 5,365,477 | 11/1994 | Cooper, Jr. et al. | 365/174 |
| 5,369,047 | 11/1994 | Hynecek | 257/222 |

OTHER PUBLICATIONS

IEEE J. Solid–State Circuits, Vol SC–9, pp. 167–178, Feb. 1974, "Characterization of Surface Channel CCD Image Arrays at Low Light Levels", by White et al.

IEEE Transactions on Electron Devices, vol. 38, No. 5, pp. 989–998, May 1991, "The Operation Mechanism of a Charge Modulation Device (CMD) Image Sensor" by Matsumoto, et al.

Proc. 1989 International Symposium on VLSI Technology, Systems and Applications (IEEE, New York, 1989), pp. 98, "A New Process for Thinned, Back–Illuminated CCD Imager Devices" by Huang et al, no month.

IEDM Tech. Dig. 1987, pp. 116–119, "A High Sensitivity Output Amplifier for CCD Image Sensor" by Matsunaga et al, no month.

Optical Engineering, vol. 26, No. 9, Sep. 1987, pp. 890–896 "420 × 420 charge–coupled–device imager and four–chip hybrid focal plane", by Burke et al.

IEDM Tech. Dig. (Washington, D.C., Dec. 1978), pp. 610–612, "A Low noise CCD output amplifier", by R. J. Brewer.

*Primary Examiner*—Wael Fahmy
*Attorney, Agent, or Firm*—Samuels, Gauthier, Stevens & Reppert

[57] ABSTRACT

A charge modulation device having a semiconductor region of a first conductivity type. An epitaxial layer of second conductivity type is provided on a portion of the semiconductor region so as to define an FET channel region. A first epitaxial region of the second conductivity type is provided adjacent to and in contact with the epitaxial layer so as to define an FET drain region, the first epitaxial region being electrically isolated from the semiconductor region. A second epitaxial region of the second conductivity type is provided adjacent to and in contact with the epitaxial layer so as to define an FET source region, the second epitaxial region being electrically isolated from the semiconductor region. A third epitaxial region of the first conductivity type or a metal oxide semiconductor is provided to the channel region between the source and drain regions.

24 Claims, 10 Drawing Sheets

CHARGE MODULATION DEVICE

This invention was made with government support under Number F19628-90-c-0002 awarded by the Air Force. The government has certain rights in the invention.

BACKGROUND OF THE INVENTION

The present invention relates to charge modulation devices, and in particular to a charge modulation device (CMD) fabricated in an epitaxially grown layer.

Substantial progress in visible solid-state image sensor arrays has been made in the detection of low-light-level signals. Pixel structures with near-reflection-limited quantum efficiencies, good collection efficiency and high fill factors have been achieved through various techniques. However, the noise created during the conversion of a charge packet into a voltage still limits the minimum number of photoelectrons that can be detected in a single packet. This is especially true for high-definition television (HDTV) cameras where the relatively high data rates require wide bandwidth readout amplifiers.

Various approaches have been taken to improve the performance of the readout amplifier and lower the input-referred noise electrons corresponding to the conversion process. A readout amplifier structure is the charge-modulation device (CMD), where single electron noise performance, at moderate frequencies, has been reported for one particular design as described in Matsuaga et al., "A high sensitivity output amplifier for CCD imager sensors", IEDM Tech. Dig., pp. 116–118, 1987, incorporated herein by reference. This low noise was the result of minimizing the effective capacitance at the charge sense location which is evident from the high responsivity values reported.

It is an object of the present invention to provide an improved charge modulation device.

It is a further object of the present invention to utilize the device as a pixel cell to advance the performance of solid state imaging arrays.

SUMMARY OF THE INVENTION

The present invention provides a charge modulation device having a semiconductor region of a first conductivity type. An epitaxial layer of second conductivity type is provided on a portion of the semiconductor region so as to define an FET channel region. A first epitaxial region of the second conductivity type is provided adjacent to and in contact with the epitaxial layer so as to define an FET drain region, the first epitaxial region being electrically isolated from the semiconductor region. A second epitaxial region of the second conductivity type is provided adjacent to and in contact with the epitaxial layer so as to define an FET source region, the second epitaxial region being electrically isolated from the semiconductor region. A third epitaxial region of the first conductivity type or a metal oxide semiconductor is provided to the channel region between the source and drain regions.

The present invention involves the fabrication of a CMD that has been integrated into the architecture of a back-illuminated charge-coupled device (CCD) process. A p-channel JFET is fabricated in an epitaxial layer adjacent to a CCD buried channel. Epitaxial layers which are grown by various techniques to form transistor based devices have been exploited to improve memory cells. The advantage of designing a JFET in the epitaxial layer, besides minimizing the capacitance, is the oxide isolation of the $p^+$ source/drain regions from the $p^-$ substrate. This feature allows the JFET to be integrated into a cell that can either be used as a single readout structure at the end of an output register or placed in two dimensional arrays to form an imaging area with active pixels. The JFET amplifier structure is intended for back-illuminated operation when used as the pixel cell in a two dimensional array. The JFET structure can also be used for front-illuminated operation but with less benefits. An advantage of this architecture is the reduction in smear due to the electrical isolation between the source/drain region and the photo converting substrate provided by this structure. Also, pixel cells can be spaced relatively close to form two dimensional arrays because of the isolation provided by the quasi three dimensional structure.

Development of a three-dimensional pixel cell is desirable as a method to advance the performance of solid state imaging arrays. The unique three-dimensional pixel design along with the aforementioned back illumination technology allows placement of a sensitive charge detection amplifier at each pixel site while preserving other imager qualities such as quantum efficiency and fill factor. Solid state detector technology is currently based upon two-dimensional detector structures which have pixels that must collect and process photocarriers within the same plane. The overall performance of such devices is constrained because, generally, the pixel cell is designed to optimize a particular characteristic at the expense of other imaging device features.

The pixel structure of the present invention will improve electrical detector performance while maintaining the optical response corresponding to back-illuminated operation. Electrical performance features include low noise and non-destructive charge sensing, negligible kTC (reset) noise, and increased tolerance to high radiation environments and/or cold temperature operation, X–Y addressable pixel output for random read out, and simple on-focal-plane signal processing functions such as nonlocalized addition or subtraction of signals. The optical performance advantages include near-reflection-limited quantum efficiencies over the visible spectrum, 100% pixel fill factor, and a flat entry surface to the detection region.

The limitations of conventional solid-state imaging array architectures and the current trend in advanced imaging array designs are addressed and overcome by the present invention. Placement of the amplifier in the pixel cell in accordance with the present invention has several advantages. Charge is sensed and converted into a voltage at the pixel in which the charge is collected, thereby avoiding the "bucket brigade" transfer process inherent in conventional charge transfer devices (CTDs) such as CCDs. Conventional CTDs operate satisfactorily in a variety of environments, but ultimately, under increasingly demanding situations, charge transfer efficiency (CTE) is drastically degraded. Measurements have shown that a dose of high energy protons equivalent to a few months in near-earth orbit can degrade CTE of unhardened imagers from 0.999995 to less than 0.999. A CTD having a CTE of 0.999 would show a 25% signal loss after only 300 transfers. Proton irradiation creates traps which randomly capture and release carriers as the charge packet is transferred from pixel to pixel. Other CTE degradation mechanisms include pixel size reduction and cold temperature operation. Cold temperature operation causes carrier freeze out of the buried channel and consequently lower-CTE surface channel operation, while reduction of pixel size causes a lowering of the fringing electric field so carriers are not properly shifted to the next pixel during charge transfer.

Placement of an amplifier at each pixel site together with an X-Y readout circuit provides the capability for selective pixel output so pixels can be accessed in any desired order, in contrast to standard CTDs which have a serial pixel output sequence. The selectable pixel output is very efficient in target-tracking applications where only those pixels surrounding the target image are read as the image travels across the pixel array. X-Y addressable devices with non-destructive charge sensing are well suited for certain types of pre-processing procedures, such as some video compression, which require reformatting the pixel output order or performing pixel subtractions.

In solid state imager technology, an alternative to CCDs is the charge injection device (CID), which outputs pixels selectively. Although the CID pixel structure is very simple and does not have an amplifier at the pixel, it suffers from fixed pattern noise caused by a wiring capacitance that varies with distance from the particular pixel location to the output amplifier. The wiring capacitance also degrades the responsivity (charge-to-voltage gain). The sensitivity is degraded as a result of the low responsivity. By adding an amplifier at the pixel, the output signal becomes independent of the wiring capacitance, so the corresponding fixed pattern noise is eliminated and the responsivity is improved. However, conventional imaging arrays using pixel amplifiers suffer from kTC noise and fixed pattern noise caused by the variation in amplifier gain from pixel to pixel, as described in White et al., "Charaterization of Surface Channel CCD Image Arrays at Low Light Levels", IEEE Journal of Solid-State Circuits, vol. SC-9, pp. 1-12 (1974), incorporated herein by reference.

Early attempts at integrating an amplifier into each pixel cell required several transistors at each site. The additional transistors, besides that of the amplifier, were used for resetting and X-Y selection of the pixel. These structures consumed much of the available area at each pixel and resulted in very poor fill factors (the percentage of the pixel area that is sensitive to light). More recent designs have integrated a single amplifier into the pixel structure resulting in better fill factors, such as described by Matsumoto et al., "The Operation Mechanism of a Charge Modulation Device (CMD) Image Sensor", IEEE Trans. on Electron Devices, vol. 38, no.5, pp. 989-998 (1991), incorporated herein by reference. The disadvantages of these structures are poor short wavelength light response, the inability to eliminate kTC noise, and a reduced fill factor. The proposed back-illuminated three-dimensional pixel of the present invention overcomes all of these disadvantages as will become apparent from the description provided herein.

An extremely sensitive floating surface detection circuit has been demonstrated by using a charge modulation device in accordance with the invention as the single output of a detector array. The responsivity of the circuit is on the order of 220 μV/e$^-$ with an output noise of less than 1 noise equivalent electron rms. The low noise output is the result of the high responsivity of the amplifier and the inherent low noise of a bulk p-channel JFET. Integrating this particular circuit into a pixel array while maintaining electrical isolation between pixels, proper reset, and no kTC noise is conventionally difficult to achieve. The proposed pixel amplifier of the present invention should have performance similar to the floating surface detection circuit, but because of the three-dimensional structure of the invention, the pixels will be well isolated from each other and suited to construction of area imaging arrays.

The source and drain regions that are oxide isolated from the semiconductor substrate for the CMD of the present invention allows pixel cells to be located closer than is possible in conventional devices. Also, the oxide isolated source and drain reduces the crosstalk between neighboring pixels by limiting the photoelectrons generated in the semiconductor substrate from being collected in these regions. Furthermore, the CMD of the present invention is preferably used for back-illumination, while conventional devices are designed for front-illuminated operation. The back-illuminated structure gives a fill factor (light sensitive fraction of the pixel cell) of 100% while the conventional devices have fill factors substantially below 100%. In addition, the back-gate architecture using the n+ diffusion provides better control of the JFET channel than the back-gate structure used in conventional devices.

DETAILED DESCRIPTION OF THE ILLUSTRATED EMBODIMENTS

Figure 1A:
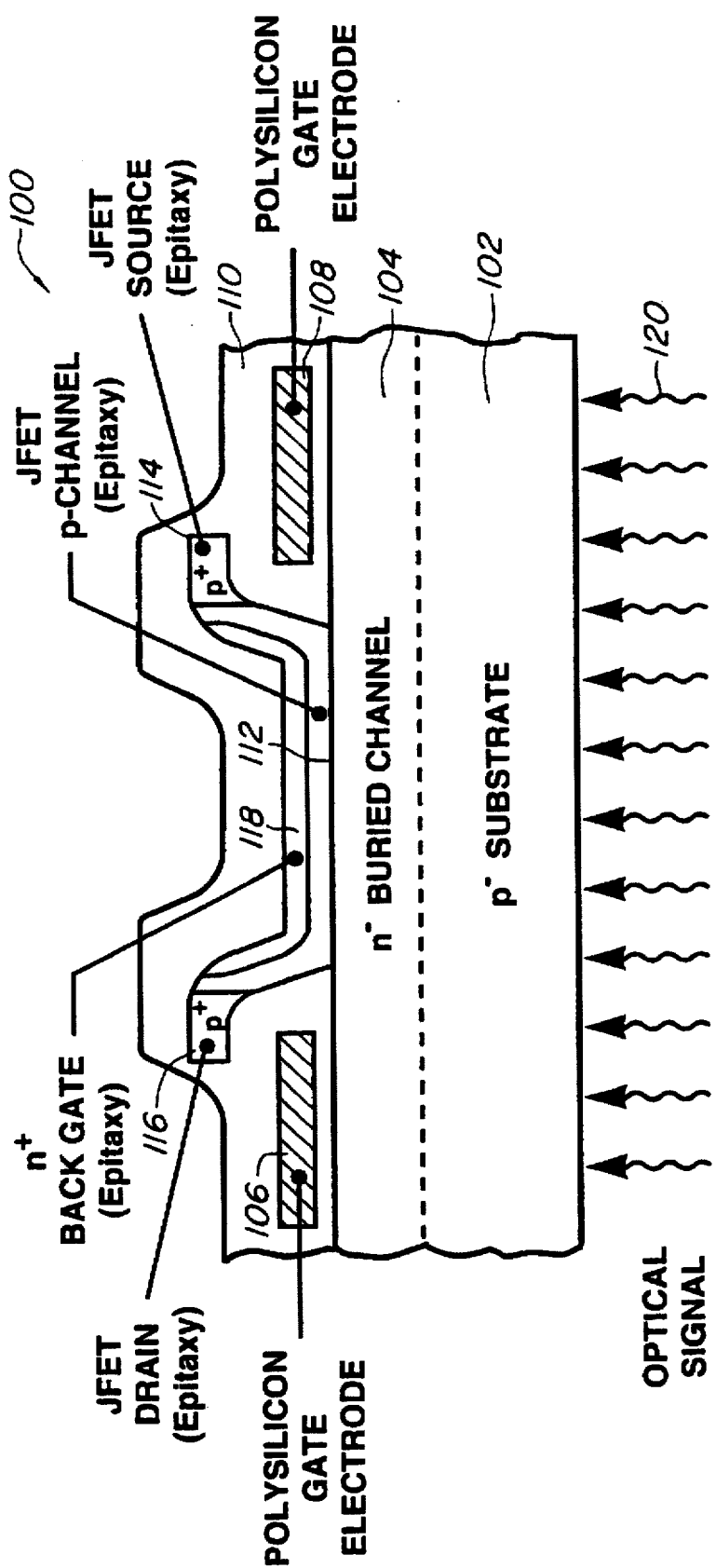
FIGS. 1A and 1B respectively show a cross-sectional view and a top plan view of a charge modulation device in accordance with the present invention.
Figure 1B:
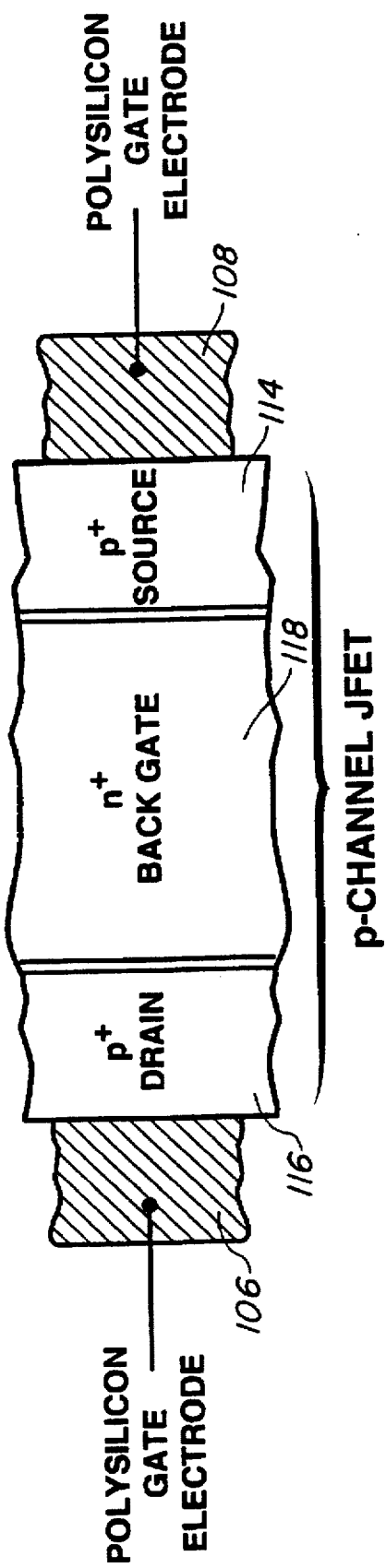

With reference now to FIGS. 1A and 1B, cross-sectional and top views of an exemplary charge modulation device 100 in accordance with the present invention are shown, respectively. Fabrication of the device initially includes the same steps presently used by MIT Lincoln Laboratory to manufacture conventional three-phase n-type buried channel CCDs. The process for fabricating such three layer polysilicon/single layer metal CCD imagers is described in Burke et al., "420×420 Charge-Coupled-Device Imager and Four Chip Hybrid Focal Plane," Opt. Eng., vol. 26, pp. 890-896 (1987), incorporated herein by reference. Accordingly, the device includes a p-type substrate 102 having an n-type buried channel region 104. As shown, the device has at least two polysilicon gate electrodes 106,108 which are covered by an oxide layer 110.

The process deviates from the standard flow after the polysilicon gate electrodes have been capped by thermal oxidation. At this point, the gate dielectric is removed from between two polysilicon gate electrodes 106,108 and the self-aligned epitaxial silicon is grown on the exposed silicon substrate creating a p-type JFET channel region 112. The p-channel epitaxial silicon can be boron doped in situ or implanted at a later step. JFET p⁺ source 114 and drain 116 regions and the n⁺ back-gate 118 are ion implanted or diffused into the appropriate regions as shown. The source and drain regions are formed so as to be electrically isolated from the underlying gate electrodes. Processing finishes with ohmic contacts made to the polysilicon gate electrodes, and to the JFET source, drain and back-gate.

In the exemplary embodiment, a conventional back-illumination fabrication process is applied to finished wafers to enhance optical performance. The back-illumination fabrication process is described in Huang et al., "A New Process for Thinned Back-Illuminated CCD Imager Devices", Proc. 1989 International Symposium on VLSI Technology, Systems and Applications (IEEE, New York, 1989), p. 98, incorporated herein by reference. In back-illuminated operation, an optical signal 120 enters through the side of the wafers opposite the polysilicon gate electrodes, thereby avoiding the light-absorbing polysilicon electrodes. This mode of operation results in increased quantum efficiencies at short wavelengths (<500nm) and near-reflection-limited values over the visible spectrum.

Figure 2:
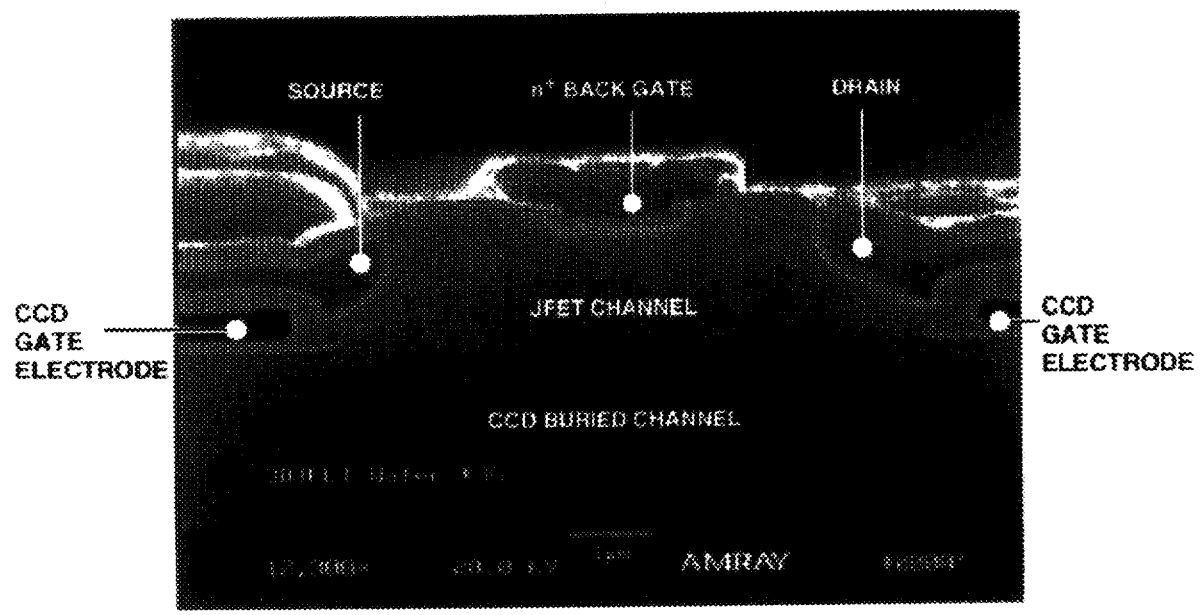
FIG. 2 shows a scanning electron microscope (SEM) photograph of a cross-sectional region of the charge modulation device of the present invention.
Figure 3:
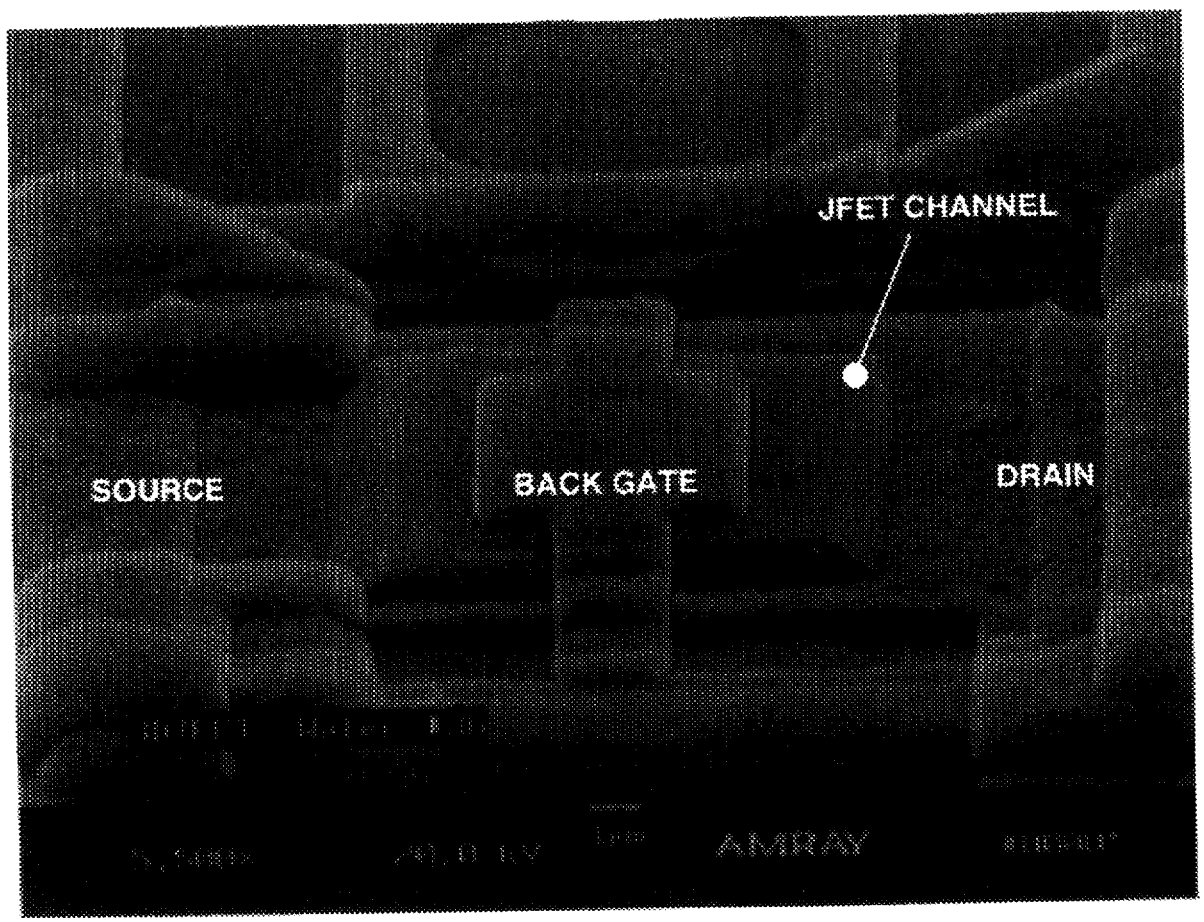
FIG. 3 shows a SEM photograph of a top plan view of the charge modulation device of the present invention.

FIGS. 2 and 3 respectively show SEM photographs of an exemplary actual device corresponding to the cross sectional and top plan views of FIGS. 1A and 1B. The SEM photographs show a device that has completed all processing steps with the exception of metalization for external contacts. The device used in the cross sectional SEM photograph received a selective etch that preferentially removed high doped silicon regions to reveal the source, drain and n⁺ back-gate areas. The fabrication process which is used to produce the device of the present invention will now be described in more detail. The JFET structure used in the device 100 is added after the creation of the CCD transfer channel 104 and the deposition of the two polysilicon gate electrode layers 106,108, including two thermally-grown polyoxide insulating layers 110. An opening is etched in the gate dielectric in a space that has been deliberately created between the two CCD gate electrodes. The etch goes down to the CCD silicon buried channel and provides seed regions for growth of the epitaxial layer.

The JFET epitaxial region 112 is formed in a two-step growth process. In the first step, a selective epitaxial growth is done to a thickness of approximately 1.2μm. During this growth step, the only silicon deposited on the exposed oxide is a single crystal region that extends about 0.8μm from the seed holes onto the oxide. The growth is done in an ASM epitaxial reactor at relatively low pressures (40 torr) using a combination of dichlorosilane and hydrochloric acid. This step is followed by a non-selective silicon growth adding another 0.4μm to the single crystal seed holes and 0.4μm polysilicon on the oxide. This layer is deposited at atmospheric pressure using silane. The boron doping in the p-channel is done in situ during the two growth steps or can be created later by an ion implantation. After the growth is completed, a mask and etch step defines the active transistor regions. Thereafter, a mask and boron implantation step is used to form the p+source 114 and drain 116 regions which finishes the formation of the JFET except for the n⁺back-gate 118.

The JFET n⁺back-gate 118 is formed by diffusion through a buried contact done during the deposition of a third polysilicon layer. This same polysilicon layer serves as a CCD gate electrode and normally would dope the floating diffusion region of the conventional readout amplifier. FIGS. 2 and 3 show the buried contact region underneath the polysilicon layer. Alternatively, a variation of the CMD process eliminates the buried contact, thereby creating an MOS as opposed to junction back-gate.

Figure 4:
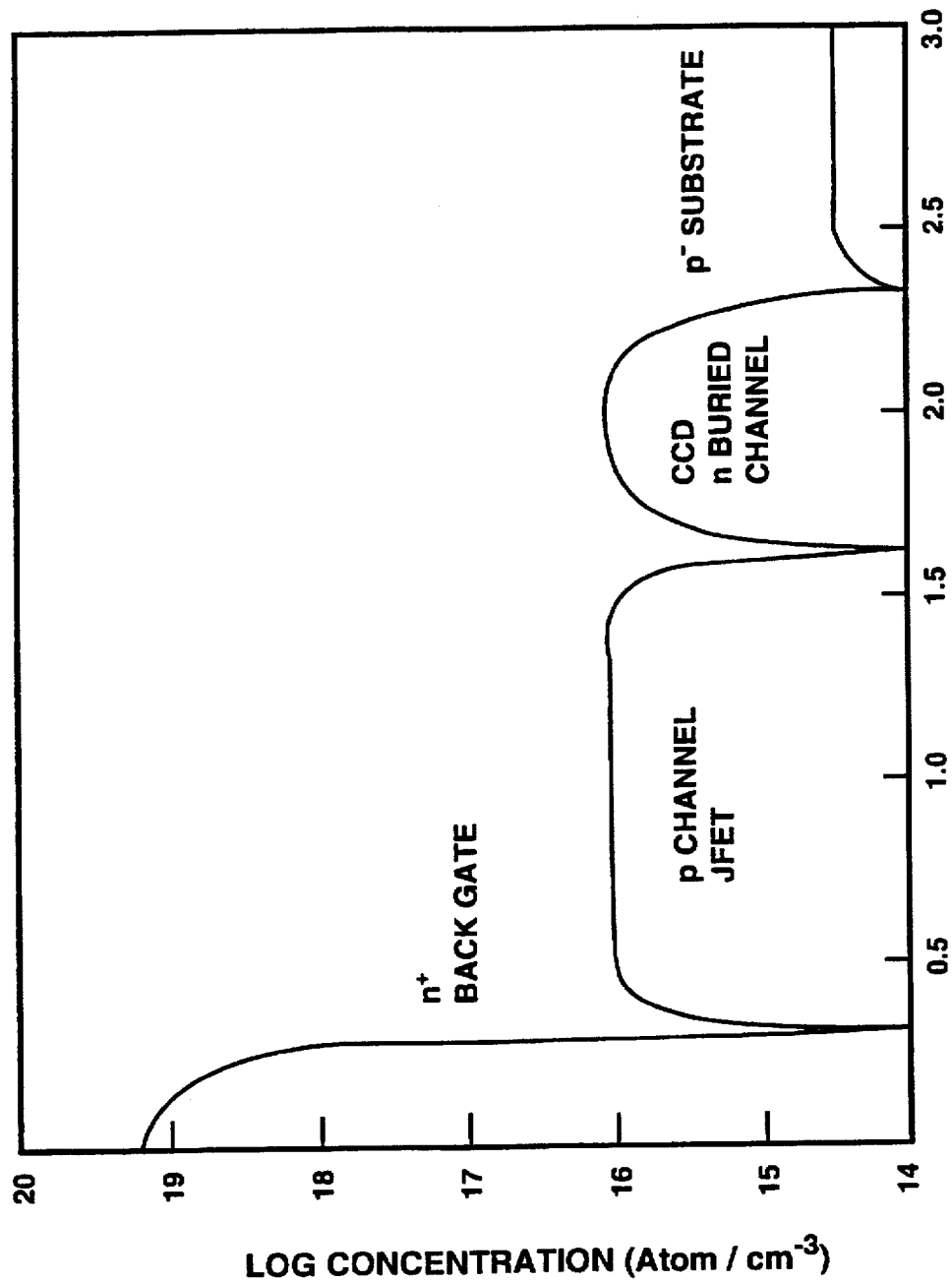
FIG. 4 shows a plot of impurity concentration versus distance in the charge modulation device of the present invention.

FIG. 4 shows a plot of impurity concentration versus distance starting at the n⁺ back-gate and ending at approximately 2μm past the initial surface of the silicon starting wafer. As shown in the plot, the back-gate consumes about 0.3μm of the grown epitaxial layer. The average impurity concentration in the JFET channel and CCD buried channel are $2 \times 10^{16}$ and $3 \times 10^{16} cm^{-3}$, respectively.

Figure 5A:
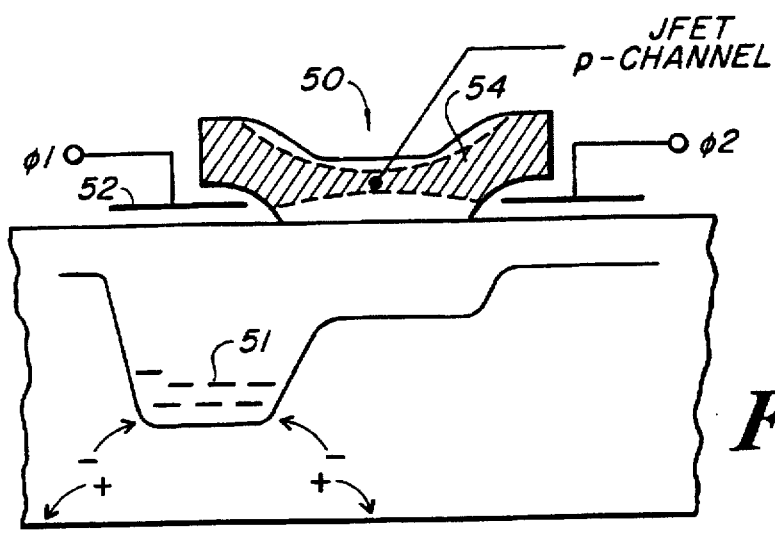
FIGS. 5A-5C shows a diagrammatic operation of the charge modulation device of the present invention operating as a unit pixel cell.
Figure 5B:
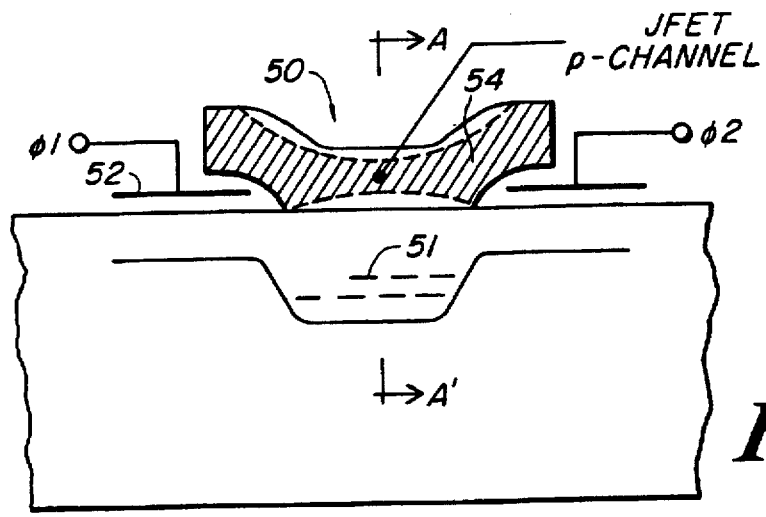
Figure 5C:
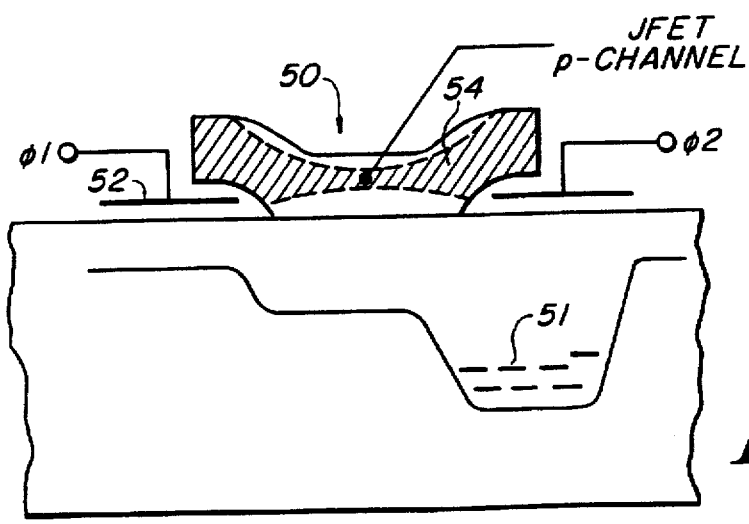

Detailed operation of the invention operating as a unit pixel cell is described with reference to FIGS. 5A–5C. In FIG. 5A, photocarriers 51 generated by an image are collected by a positively biased electrode 52 (φ1). After an integration period, the photocarriers are then transferred under the p-channel JFET 54 by lowering the electrode potential as shown in FIG. 5B. The photocarriers, in this case electrons, modulate the channel resistance of the JFET, which in turn causes a change in voltage across a selected load device (either a resistor or current source). The load device is located outside the imaging area and is connected to the source of the JFET by a conductive line. This voltage change constitutes the output signal.

Figure 6:
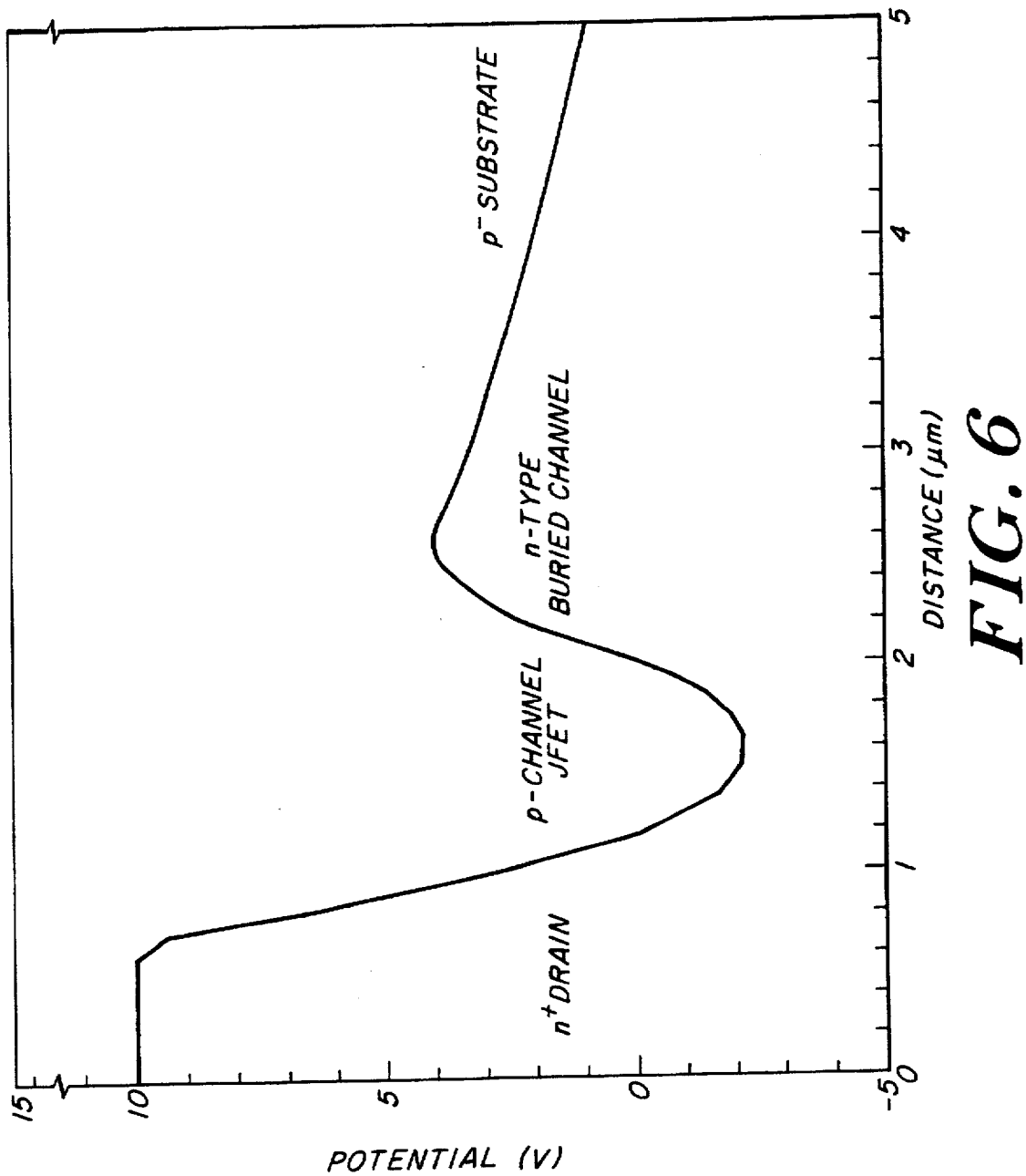
FIG. 6 shows a plot of the potential versus vertical position through the center of the device of the present invention taken along line A-A' of FIG. 5B.

A plot of the potential versus vertical position through the center of the JFET along line A–A' of FIG. 5B is shown in FIG. 6. The plot shows the location of the potential wells for holes in the JFET p-channel and the photoelectrons in the n-type buried channel. The potential minimum shows the location of the JFET p-channel while the local maximum at approximately 2.6μm identifies the location of the depleted n-type buried channel.

A well known device simulator called PISCES, which simultaneously solves the Poisson and continuity equations, was used to calculate the potential in the plot of FIG. 6. The electrode adjacent to the JFET is positively biased to transfer the electrons from the region under the p-channel JFET. Notice that the charge has been detected nondestructively and can be sensed repeatedly using the described method. The charge may also be transferred through following or subsequent pixels where charge sensing can be repeated or the electrons can be temporarily stored. This type of charge manipulation would make simple focal-plane signal processing feasible.

The pixel cell 50 can be made very compact by replacing the two electrodes shown by smaller channel stop regions. In this case, the photocarriers are collected directly underneath the JFET channel. The voltage across the load device is sensed the first time at the end of an image integration period. The n⁺ back-gate is then biased more positively such that the depletion region from the back-gate extends through the JFET p-channel into the buried channel. The positive bias creates an electric field that accelerates the photoelectrons to the n⁺ back-gate and empties the buried channel well. The n⁺ back-gate is returned to its original value and a second signal sample is taken without the photocarriers. The two samples are subtracted to obtain the voltage change due to the photocarriers. There is no kTC noise associated with this read process, since all the signal charge is drained from the buried channel. Although the pixel cell is more compact, the ability to transfer charge to adjacent pixels no longer exists. Also, the design of the n⁺ back-gate becomes more critical since it must function both as the reset device and the column or row selection device, as described hereinafter.

Most solid state imaging arrays have the detection node physically separated, laterally, from the amplifier. The sense circuit typically consists of a floating diffusion diode electrically connected by a conductive strap to a MOSFET source-follower amplifier. The proposed pixel cell has a compact detection circuit design with the n-type buried channel under the JFET being the detection node as well as the p-channel JFET gate. This charge sense structure serves to maximize responsivity by minimizing the parasitic capacitance associated with conventional charge-to-voltage conversion circuitry. Further reductions in the JFET parasitic capacitances are accomplished by isolating the source and drain regions by techniques similar to semiconductor-on-insulator devices.

PISCES simulations have been used to estimate the responsivity of the pixel cell structure previously described. A value of 160 to 175 $\mu V/e^-$ was obtained when the responsivity was calculated with the $n^+$back-gate shorted to the source. PISCES can be used to estimate the amplifier noise if the JFET is assumed to be thermal noise limited. This is a fairly reasonable assumption for a p-channel JFET because the 1/f noise contribution to the total noise is usually small for bandwidths greater than a few megahertz. The noise value calculated from PISCES simulations is about 0.6 noise equivalent electrons for a 10 MHz bandwidth and assuming the load device is a current source. The $n^+$ back-gate can be used in a negative feedback mode by setting the back-gate to a fixed dc voltage. This type of operation gives lower responsivity, but the dynamic range and bandwidth are increased. The signal-to-noise ratio, which is the important amplifier parameter when the system noise is dominated by the pixel amplifier, will be similar to the no-feedback condition. The responsivity calculated in the feedback mode is 30 to 35 $\mu V/e^-$.

The $n^+$ JFET back-gate will be used in selective pixel addressing and/or vertical resetting to enable efficient arraying of pixel cells. Pixel selection occurs by applying a high positive bias to the back-gate of all pixels sites not selected. This would turn off these sites by completely depleting through the JFET p-channel region. Thus, even if charge is in the n-type buried channel under the JFET channel, there is no output signal. A particular pixel to be outputted would be selected by lowering the back-gate voltage to allow formation of the p-channel. The JFET would also be designed so the $n^+$back-gate would be capable of removing photocarriers from the n-type buried channel in a vertical reset of the pixel. As described above, this would be done by applying a very high positive voltage to the back-gate not only causing the p-channel to be completely depleted, but also bending the conduction band so that an electric field is developed which sweeps the electrons from the n-type buried channel to the more positively biased $n^+$ back-gate.

Finally, the pixel cell in accordance with the present invention is expected to be more tolerant to radiation and cold temperature environments than CTDs, such as CCDs, because no charge transfer is required to output the charge in the X-Y addressing scheme. Also, the JFET pixel amplifier has no gate oxide, which is the region most sensitive to ionizing radiation.

Figure 7:
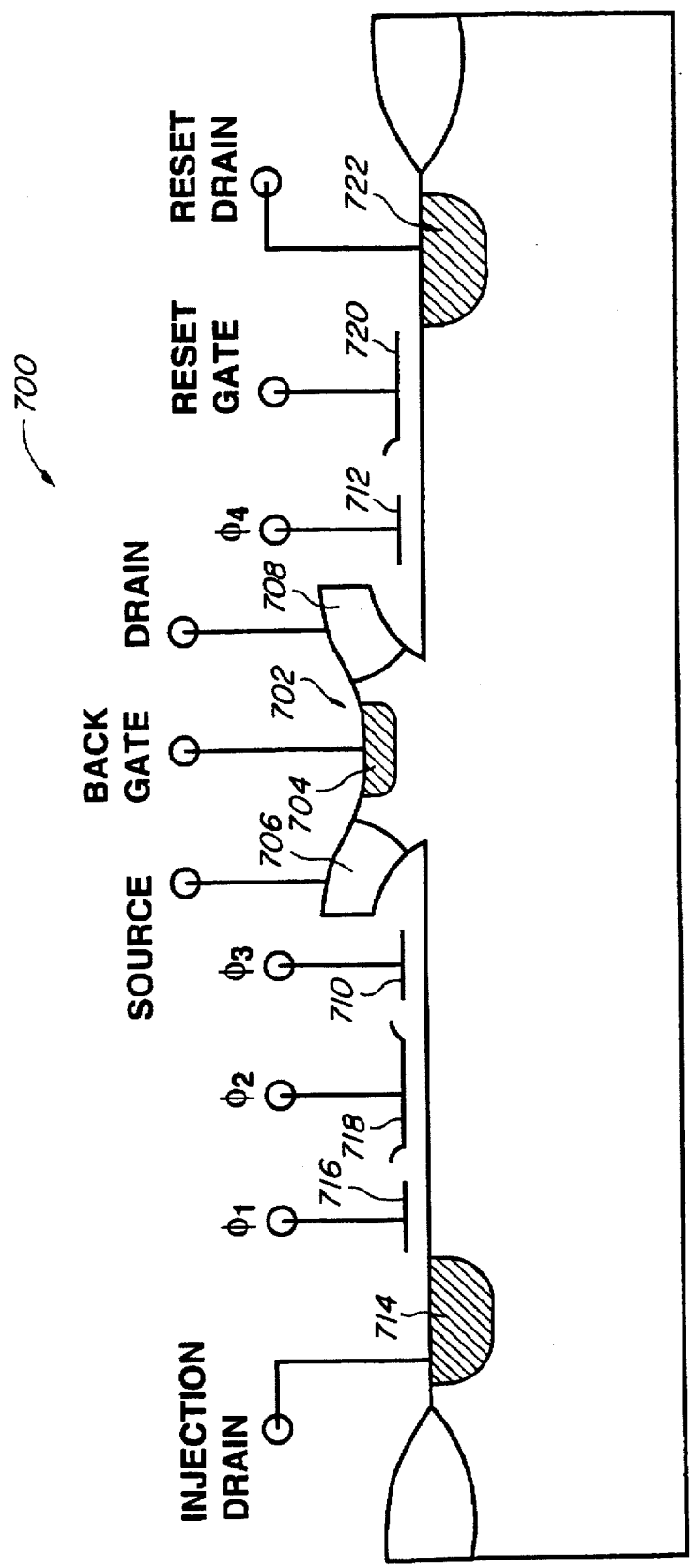
FIG. 7 shows an exemplary test structure including a charge modulation device in accordance with the present invention.

An exemplary test structure including a device 702 in accordance with the present invention was used to test the JFET and CCD operation as shown in FIG. 7. The device 702 included a back-gate 704, a source 706, a drain 708, and gate electrodes 710,712. The test structure additionally included an injection drain 714, barrier gate electrodes 716,718, a rest gate 720 and a rest drain 722.

Figure 8:
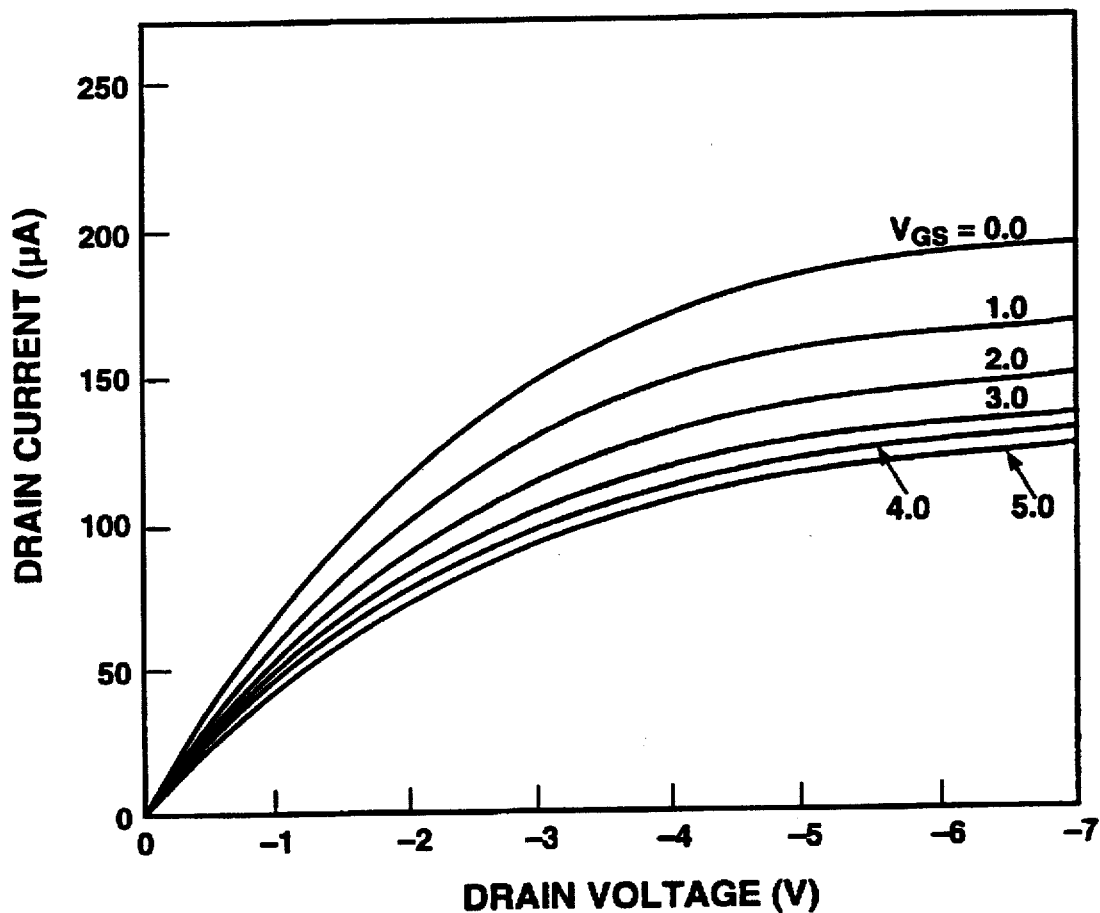
FIG. 8 shows I-V curves for the JFET test device where the gate voltage is being applied to the buried channel and the JFET back-gate is held at a constant bias.

In all the dynamic measurements, the JFET was the sense transistor and 100kΩ or 200kΩ resistors were used for the load of the source-follower amplifier. The JFET test device, used to acquire the data, had a channel length and width of 4 μm. FIG. 8 shows I-V curves for the JFET test device where the gate voltage is being applied to the buried channel and the JFET back-gate is held at a constant bias. The curves indicate that the buried channel, underneath the JFET, becomes fully depleted for voltages in excess of six volts when the JFET source is grounded.

The responsivity was calculated from measurement of the JFET source-follower output voltage versus injected charge packet size. Charge packets were injected, at a constant frequency, under the CCD electrodes using the $n^+$ diode. The CCD gate electrodes then transferred the charge packet to the buried channel region under the JFET. The charge packet modulates the JFET channel causing the voltage to change across the load resistor. After sensing the charge, the packet is transferred by the gate electrodes to the defined reset diode. The continuous transfer of the charge creates a current out of the reset diode that was measured using an electrometer. The output voltage change for a given charge packet is measured at the output of the source-follower and used along with the reset drain current in the calculation of the responsivity.

Responsivity values of 66 $\mu V/e$ were measured when devices were tested with the back-gate AC shorted to the source while values of approximately 28 $\mu V/e$ were measured with the short removed. Creating an AC short from the back-gate to the JFET source reduces the contribution of the source to back-gate capacitance contribution to the overall sense capacitance, thereby increasing the responsivity. However, eliminating this feedback path also increases the noise by about the same factor so in general the signal-to-noise remains the same or is less.

Figure 9:
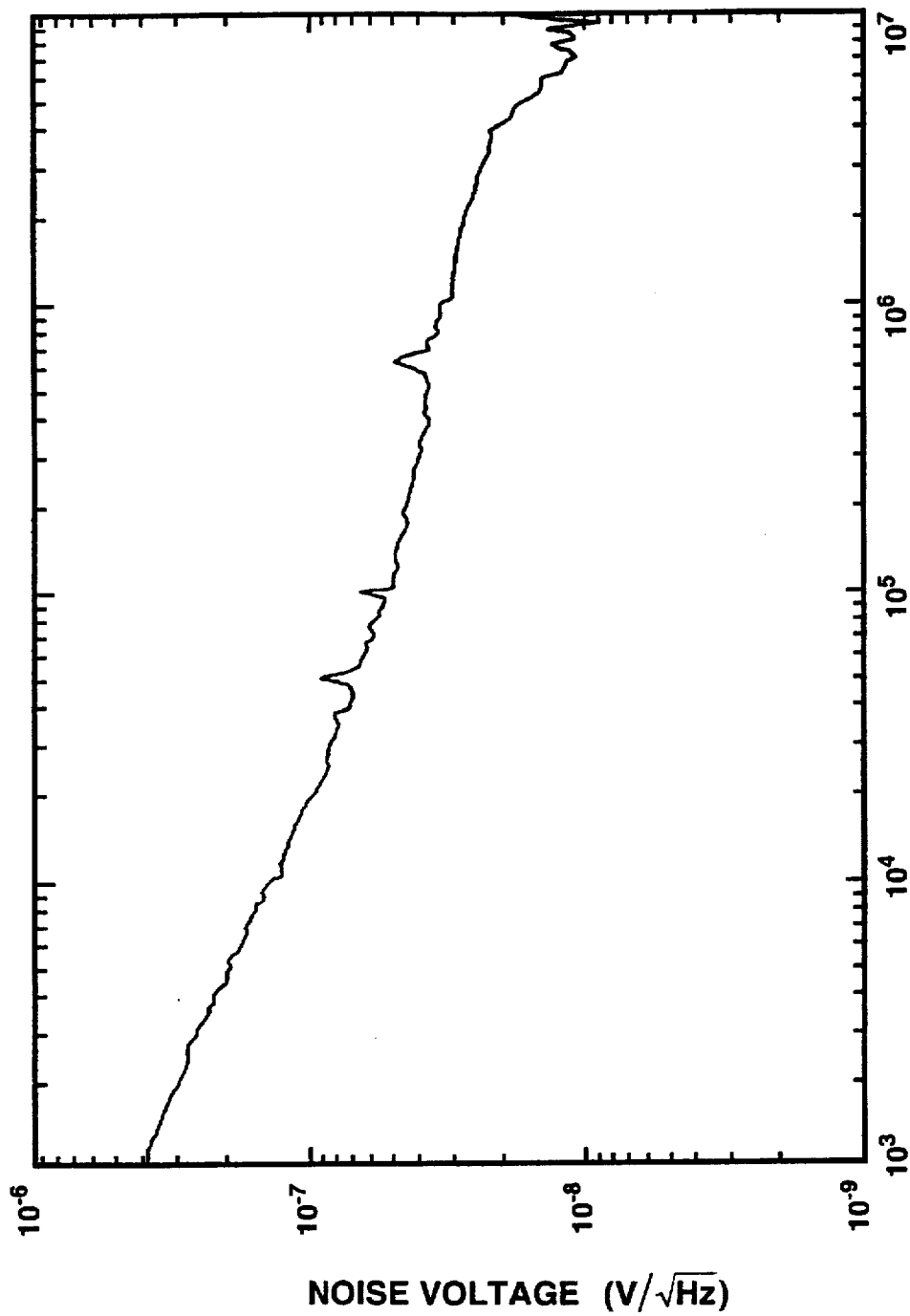
FIG. 9 shows the noise spectral density curve that is representative of finished JFET test devices in accordance with the present invention.

To determine the input referred noise of the readout amplifier, the noise spectral density of the JFET source-follower was measured. FIG. 9 shows the noise spectral density curve that is representative of finished JFET test devices. The curve shown in FIG. 9 was taken with the back-gate to source feedback path present on the source-follower and a load resistor value of 100kΩ. The CCD n-buried channel was completely depleted as would be the case under normal operating conditions. For the majority of devices tested, the low frequency portion of the noise spectral density showed a $1/f^n$ dependence with n being 1.0 to 1.5. This frequency dependence is thought to be caused by the oxide regions that bound the JFET channel region. A few of the test devices did show a Lorenztian dependence at low frequency that could be reduced to negligible levels with modest cooling. This effect is suspected to be caused by traps in the partially depleted source/drain polysilicon regions. As the CCD well is filled with carriers the thermal noise of the JFET at high frequencies decreases as expected.

The input referred noise of the JFET source-follower amplifier was calculated using the measured responsivity and noise spectral density for the depleted CCD buried channel with feedback. The calculation assumed a low pass filter with a 3dB cutoff frequency of 5MHz, correlated double sampling, and JFET feedback operation. The noise estimated under these operating conditions was approximately 4 electrons.

The noise was also measured for the JFET operating without feedback. Under this condition, the noise spectral density did increase as expected. However, the noise response was somewhat greater than could be attributed to the increase in responsivity alone.

Accordingly, an epitaxially grown JFET has been integrated into the architecture of a conventional CCD process.

The JFET amplifier is intended to be used either at the end of a CCD output register or arrayed into pixel cells for converting photo charges into a voltage. As has been shown experimentally, the quasi three-dimensional JFET structure results in low parasitic capacitances associated with the sense transistor. By electrically isolating the source/drain regions from the charge collecting substrate, charge sharing effects, as are common in short channel MOSFET's, have been minimized. The electrical isolation is also important if the JFET amplifier is used to create an active pixel cell. The isolated source regions from the photo converting substrate reduces smear caused by photoelectrons being collected from pixels in a column or row with common source line connections.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A charge modulation device comprising:
   a semiconductor region of a first conductivity type;
   an epitaxial layer of second conductivity type provided on a portion of said semiconductor region so as to define an FET channel region;
   a first epitaxial region of said second conductivity type provided adjacent to and in contact with said epitaxial layer so as to define an FET drain region, said first epitaxial region being isolated from said semiconductor region;
   a second epitaxial region of said second conductivity type provided adjacent to and in contact with said epitaxial layer so as to define an FET source region, said second epitaxial region being isolated from said semiconductor region; and
   a third epitaxial region provided on said channel region between said source and drain regions.

2. The device of claim 1, wherein said third epitaxial region comprises a region of said first conductivity type.

3. The device of claim 1, wherein an insulating layer is provided between said semiconductor region and said first and second epitaxial regions.

4. The device of claim 3, wherein said insulating layer comprises an oxide.

5. The device of claim 3, wherein first and second gate electrodes are provided between said semiconductor region and said first and second epitaxial regions, respectively.

6. The device of claim 3, wherein first and second channel stop regions are provided between said semiconductor region and said first and second epitaxial regions, respectively.

7. The device of claim 1, wherein said semiconductor region comprises a semiconductor substrate.

8. The device of claim 1, wherein said semiconductor region comprises a doped layer of said first conductivity type provided in a semiconductor substrate of said second conductivity type.

9. The device of claim 1, wherein said device is configured as a pixel cell.

10. The device of claim 9, wherein said pixel cell is adapted for back-illumination operation.

11. The device of claim 9, wherein said pixel cell is arranged in an array of similarly configured pixel cells to form an imager.

12. The device of claim 10, wherein said pixel cell is arranged in an array of similarly configured pixel cells to form an imager.

13. The device of claim 9, wherein said device is configured within a CCD output register.

14. A charge modulation device comprising:
    a substrate of a first conductivity type;
    a doped layer of a second conductivity type provided in said substrate;
    an epitaxial layer of said first conductivity type provided on a portion of the surface of said doped layer so as to define an FET channel region;
    a first epitaxial region of said first conductivity type provided adjacent to and in contact with said epitaxial layer so as to define an FET drain region;
    a second epitaxial region of said first conductivity type provided adjacent to and in contact with said epitaxial layer so as to define an FET source region; and
    a third epitaxial region provided on said channel region between said source and drain regions.

15. The device of claim 14, wherein said third epitaxial region comprises a region of said second conductivity type.

16. The device of claim 14, wherein an insulating layer is provided between said doped layer and said first and second epitaxial regions.

17. The device of claim 16, wherein said insulating layer comprises an oxide.

18. The device of claim 16, wherein first and second gate electrodes are provided between said doped layer and said first and second epitaxial regions, respectively.

19. The device of claim 16, wherein first and second channel stop regions are provided between said doped layer and said first and second epitaxial regions, respectively.

20. The device of claim 14, wherein said device is configured as a pixel cell.

21. The device of claim 20, wherein said pixel cell is adapted for back-illumination operation.

22. The device of claim 20, wherein said pixel cell is arranged in an array of similarly configured pixel cells to form an imager.

23. The device of claim 21, wherein said pixel cell is arranged in an array of similarly configured pixel cells to form an imager.

24. The device of claim 20, wherein said device is configured within a CCD output register.

* * * * *